(12) United States Patent
Sugahara

(10) Patent No.: US 8,031,041 B2
(45) Date of Patent: Oct. 4, 2011

(54) MICRO POWER CONVERTER

(75) Inventor: Satoshi Sugahara, Matsumoto (JP)

(73) Assignee: Fuji Electric Systems Co., Ltd., Tokyo (JP)

( * ) Notice: Subject to any disclaimer, the term of this patent is extended or adjusted under 35 U.S.C. 154(b) by 268 days.

(21) Appl. No.: 12/292,959

(22) Filed: Dec. 1, 2008

(65) Prior Publication Data

US 2009/0146638 A1    Jun. 11, 2009

(30) Foreign Application Priority Data

Dec. 5, 2007  (JP) ................................ 2007-314294

(51) Int. Cl.
    *H01F 5/00*    (2006.01)
(52) U.S. Cl. ........................................ 336/200; 336/223
(58) Field of Classification Search ............... 363/21.12; 336/200, 232, 223
    See application file for complete search history.

(56) References Cited

U.S. PATENT DOCUMENTS

| 7,042,325 | B2 * | 5/2006  | Giandalia et al. ............. 336/200 |
| 7,149,097 | B1 * | 12/2006 | Shteynberg et al. ............ 363/16 |
| 7,298,238 | B1 * | 11/2007 | Eaton et al. ................... 336/200 |
| 7,505,288 | B2 * | 3/2009  | Duvnjak ..................... 363/21.18 |
| 2004/0070893 | A1 * | 4/2004 | Ahn et al. ........................ 361/38 |
| 2007/0268729 | A1 * | 11/2007 | Choi et al. ..................... 363/132 |
| 2008/0211566 | A1 * | 9/2008  | Graovac et al. ................ 327/419 |

FOREIGN PATENT DOCUMENTS

| JP | 07-177740   | 7/1995 |
| JP | 2000-243630 | 9/2000 |
| JP | 2004-072815 | 3/2004 |
| JP | 2004-274004 | 9/2004 |
| JP | 2006-011472 | 1/2006 |
| JP | 2007-081146 | 3/2007 |
| JP | 2007-214248 | 8/2007 |

* cited by examiner

*Primary Examiner* — Anh Mai
(74) *Attorney, Agent, or Firm* — Rabin & Berdo, P.C.

(57) ABSTRACT

An object of the invention is to provide a micro power converter of a step-up and step-down type without requiring more than two semiconductor switches, without increasing the size of a semiconductor chip, and without degrading efficiency. A micro power converter comprises a micro transformer composed of a planar transformer having a structure including a conductor wound on and through a planar magnetic core, and a semiconductor chip including semiconductor switches S1, S2, and a control circuit for controlling the switches. By constructing a flyback transformer using a micro transformer composed of a planar transformer, a micro power converter of a step-up and step-down type is provided having two semiconductor switches and an overall size comparable to a conventional micro power converter.

9 Claims, 13 Drawing Sheets

MICRO POWER CONVERTER

CROSS-REFERENCE TO RELATED APPLICATION

This application is based on, and claims priority to, Japanese Patent Application No. 2007-314294, filed on Dec. 5, 2007 contents of which are incorporated herein by reference.

BACKGROUND OF THE INVENTION

The present invention relates to a micro power converter miniaturized by integrating a micro magnetic element and a semiconductor chip, in particular to a micro power converter of a step-up and step-down type. A micro power converter in power converters represented by DC-DC converters (that are switching power supplies) is generally composed by integrating a micro magnetic element and a semiconductor chip to miniaturize the converter. FIGS. 6(a), 6(b), and 6(c) show an example of construction of a micro inductor used in a micro power converter. The inductor is composed of a conductor 2 wound on and through a planar magnetic core 1, forming a solenoid coil, as shown in FIGS. 6(a), 6(b), and 6(c). FIG. 6(a) is a plan view of the inductor 10 provided with the conductor 2 and terminals 3 on the magnetic core 1; FIG. 6(b) is a sectional view of the micro inductor cut along the line a-a' in FIG. 6(a) showing an arrangement of the conductor 2 on the magnetic core 1 and connection of the conductor 2 on the both surfaces of the magnetic core 1; and FIG. 6(c) is a sectional view of the micro inductor cut along the line b-b' in FIG. 6(a) showing an arrangement of the conductor 3 on the magnetic core 1 and connection of the terminals 3 on both surfaces of the magnetic core 1.

FIG. 7 and FIG. 8 show examples of construction of micro power converters using the micro inductor 10 shown in FIG. 6. The converter of FIG. 7 has a structure in which terminals 3 are connected to pads 5 provided on a front surface 21 of a semiconductor chip 20 through joints 4 (that are bumps), connecting the micro inductor 10 and the semiconductor chip 20. The converter of FIG. 8 has a structure in which terminals 3 are connected to pads 5 provided on a front surface 21 of a semiconductor chip 20 through wires 6, connecting the micro inductor 10 and the semiconductor chip 20. The structures of FIG. 7 and FIG. 8 are different from each other in that the back surface 22 of the semiconductor chip 20 faces outside with respect to the micro inductor 10 in the structure of FIG. 7 and inside in the structure of FIG. 8.

Japanese Unexamined Patent Application Publication No. 2004-072815 discloses a basic structure of a micro power converter having a construction similar to that of the micro power converter shown in FIG. 7. Japanese Unexamined Patent Application Publication No. 2007-081146 discloses a basic structure of a micro power converter having a construction similar to that of the micro power converter shown in FIG. 8. Japanese Unexamined Patent Application Publication No. 2000-243630 listed below discloses a planar transformer constructed using through holes. The conventional micro power converters are miniaturized by integrating a micro inductor 10 and a semiconductor chip 20 in a structure as shown in FIG. 7 and FIG. 8.

FIG. 9, FIG. 10, and FIG. 11 show examples of actual circuits to implement a micro power converter. The circuit example of FIG. 9 is the one for implementing a step-down type converter; the circuit example of FIG. 10 is the one for implementing a step-up type converter; and the example of FIG. 11 is the one for implementing an inverting converter. Every example in the three Figures constructs a micro power converter 30 with a micro inductor 10 and a semiconductor chip 20 incorporating two or one of the semiconductor switches S1 and S2. No circuit example of FIG. 9, FIG. 10, and FIG. 11 is an example of a step-up and step-down type converter.

The circuits shown in FIG. 9, FIG. 10, and FIG. 11 may be combined to arrive at the circuit shown in FIG. 12. However, the resulting circuit is deficient for at least the following reasons. In the circuit construction shown in FIG. 12, four semiconductor switches must be incorporated. Here, the on-resistance of switches in a step-down operation is the sum of the resistances of two series-connected switches S1 and S4 or S2 and S4, and on-resistance of switches in the case of step-up operation is the sum of resistances of two series-connected switches S1 and S3 or S1 and S4. Because circuit resistances increase due to the increased resistance of switches, efficiency is degraded. In order to counteract this degradation of efficiency, semiconductor switches S1 through S4 must be enlarged in order to alleviate the degradation of efficiency. Power consumption in semiconductor chip 20' increases in order to drive the four enlarged switches S1 through S4, and, therefore, the semiconductor chip 20' increases in size due to the above-mentioned issues.

Japanese Unexamined Patent Application Publication No. H07 177740 listed below discloses use of a flyback converter for a step-up and step-down means. FIG. 13 shows an example of an ordinary circuit for implementing a flyback converter. Switch S2 in FIG. 13 can be replaced by a diode, likewise implementing the converter.

A conventional transformer is larger than other components of a converter and, as a matter of course, is larger than the inductor 10 used in the step-up and step-down converter shown in FIG. 12. In practice, the size of a transformer is a primary factor in determining the size of a power supply. Therefore, there is no teaching in the common practice by those skilled in the art to use a flyback converter to miniaturize a step-up and step-down converter of FIG. 12; that is, there is no teaching for using a flyback converter for the purpose of implementing a micro power converter of a step-up and step-down type. Rather, the usage of a flyback converter conventionally increases the size of a power converter large-sized. As described above, semiconductor switches are conventionally designed to be increased in number and size in order to improve efficiency. The large size of a semiconductor chip due to the conventional design has not been addressed because an inductor and a transformer are typically much larger than a semiconductor chip and thus, the size of a semiconductor chip itself affects the size of an overall power supply very little.

For implementing a conventional step-up and step-down converter in a micro power converter in these circumstances, the number of semiconductor switches remains at four and the size of a semiconductor chip is reduced by devising layout of the semiconductor chip and semiconductor production process. relying only on these methods of size reductions inhibits implementation of a micro power converter.

SUMMARY OF THE INVENTION

In view of this situation, an object of the invention is to provide a micro power converter of a step-up and step-down type without increasing the number of semiconductor switches over those in the micro power converters shown in FIGS. 9 through 11, without increasing the size of a semiconductor chip, and without degrading efficiency.

A micro power converter of the invention comprises an integrated structure including a micro transformer including a conductor wound on and through a planar magnetic core, and a semiconductor chip having two semiconductor switches mounted thereon. The application of a planar transformer to the conventional constructions of the micro power converters of FIG. 7 and FIG. 8 allows construction of a flyback converter having an overall size comparable to that of a conventional micro power converter as shown in FIG. 7 and FIG. 8.

According to the invention, a micro power converter of a step-up and step-down type may be implemented without increasing a size of a semiconductor chip or degradation of efficiency due to an increase in the number of semiconductor switches.

Figure 1:
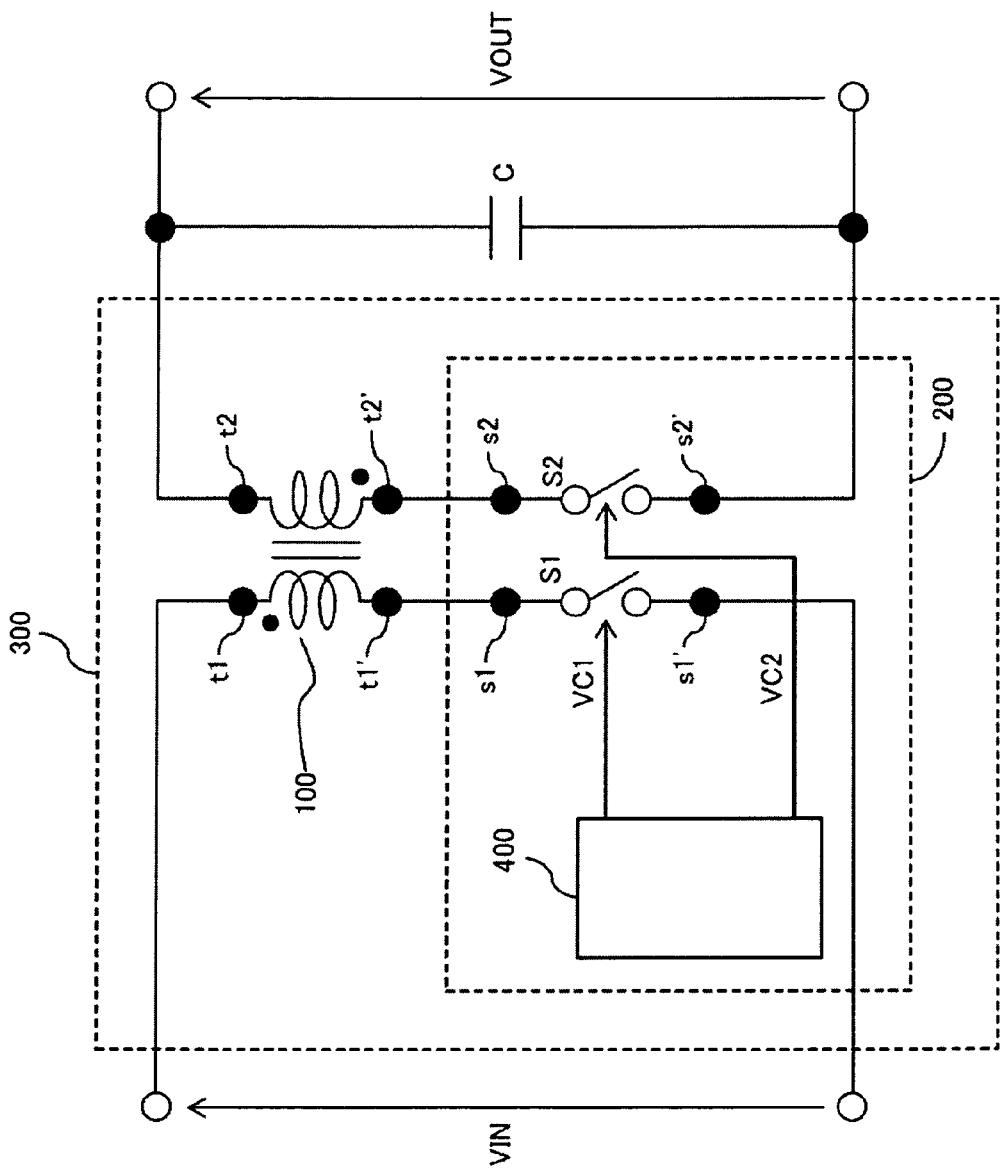
FIG. 1 shows a circuit construction to implement a micro power converter according to an embodiment of the invention.
Figure 4A:
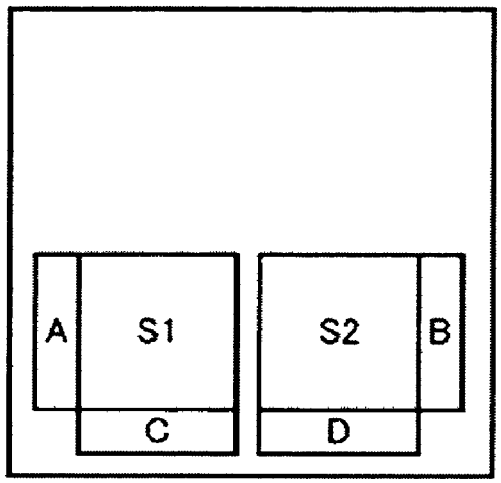
FIGS. 4(a), 4(b) and 4(c) show a first arrangement example of switches S1 and S2 in the semiconductor chips used in the micro power converter of FIG. 1.
Figure 4B:
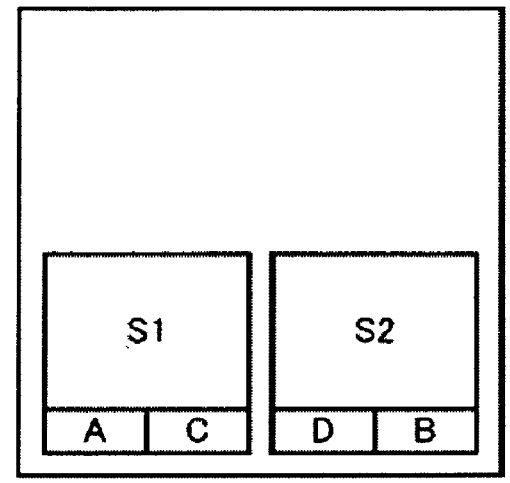
Figure 4C:
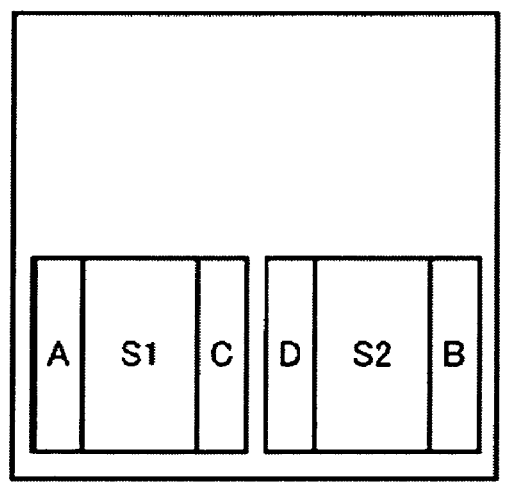
Figure 5A:
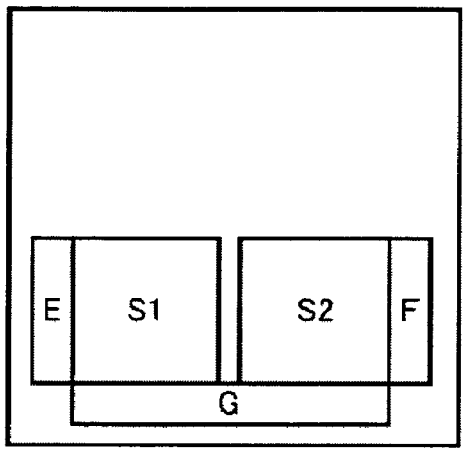
FIGS. 5(a), 5(b) and 5(c) show a second arrangement example of switches S1 and S2 in the semiconductor chips used in the micro power converter of FIG. 1.
Figure 5B:
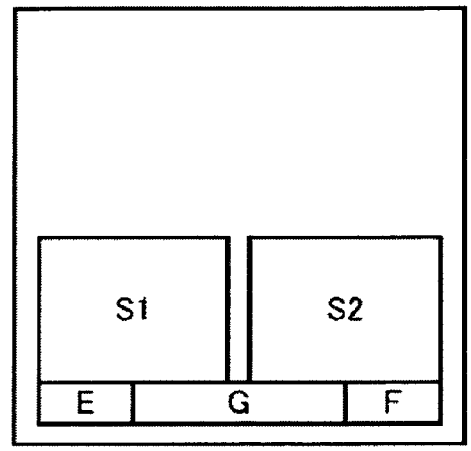
Figure 5C:
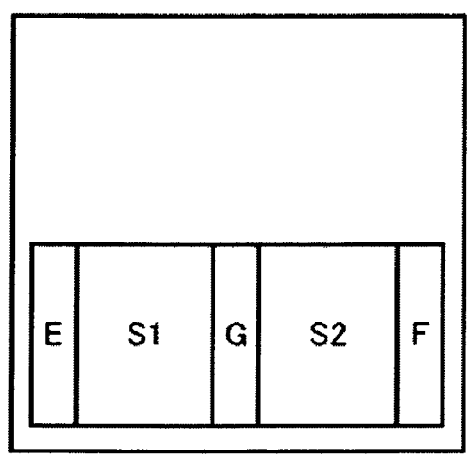
Figure 6A:
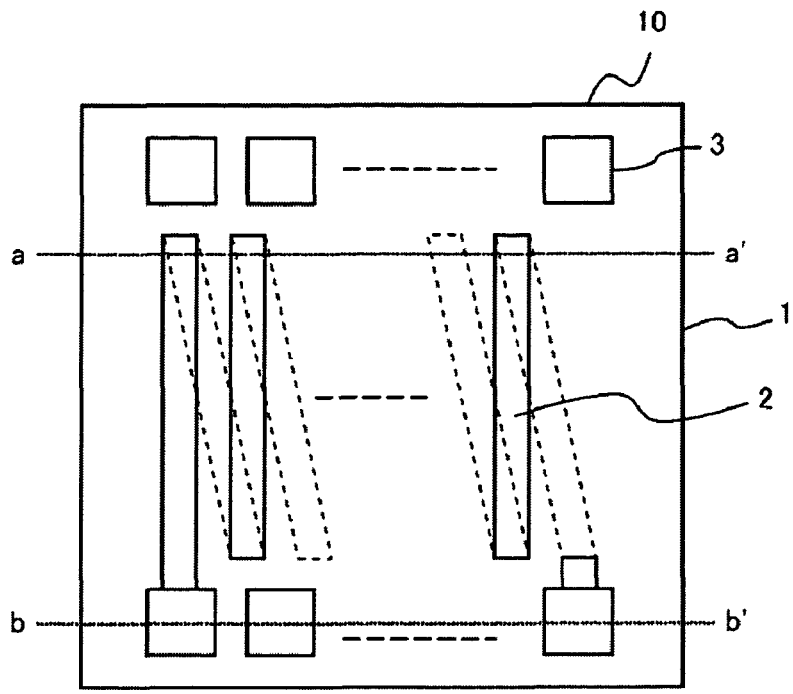
FIGS. 6(a), 6(b) and 6(c) show a construction example of a conventional micro inductor used in a micro power converter.
Figure 6B:
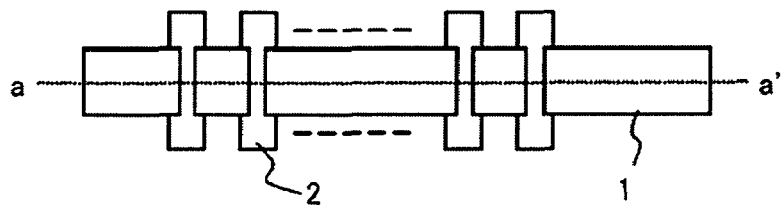
Figure 6C:
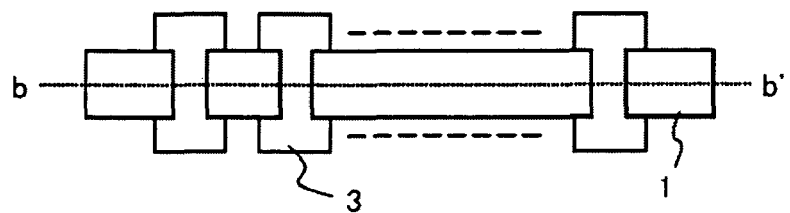

Table 1 is a table of correspondence between: the terminals s1, s1' of the switch S1 and the terminals s2, s2' of the switch S2 in FIG. 1; and the terminals A, C, E, G of the switch S1 and the terminals B, D, F, G of the switch S2 in FIG. 4 and FIG. 5; and Table 2 is a table of correspondence between: the terminals t1, t1', t2, t2' in FIG. 1, and the transformer terminals a, b, c, d in FIGS. 2(a), 2(b), and FIGS. 3(a), 3(b), 3(c).

DETAILED DESCRIPTION OF THE INVENTION

Some preferred embodiments according to the invention will be described below with reference to the accompanying drawings.

Figure 7:
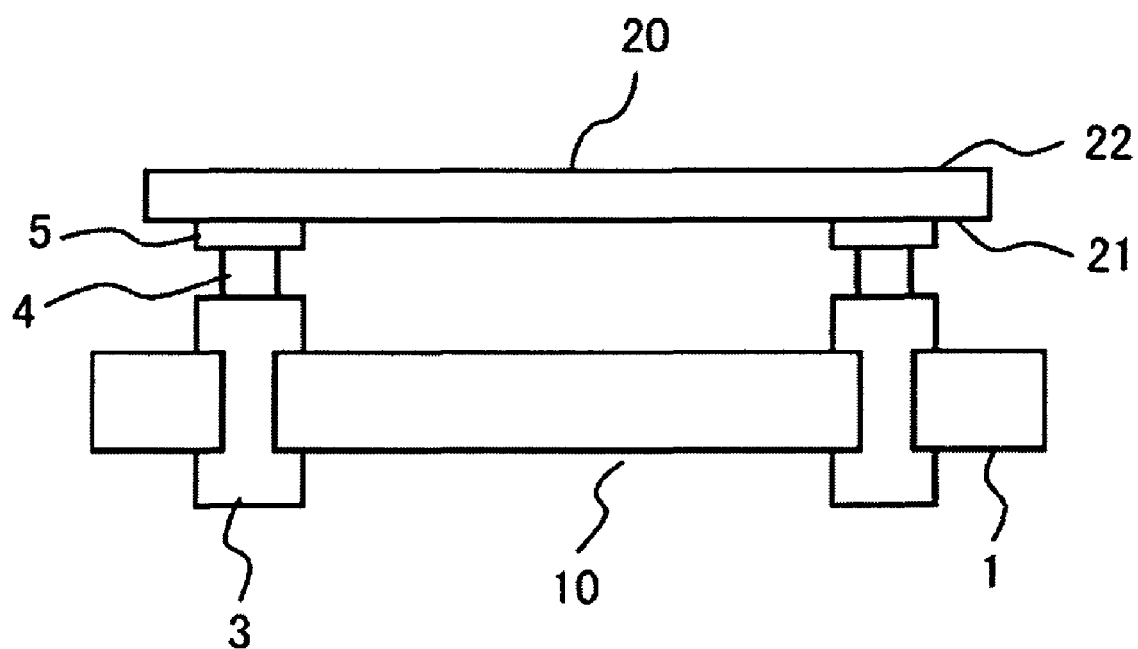
FIG. 7 shows a first construction example of a micro power converter using the micro inductor shown in FIGS. 6(a), 6(b) and 6(c)
Figure 8:
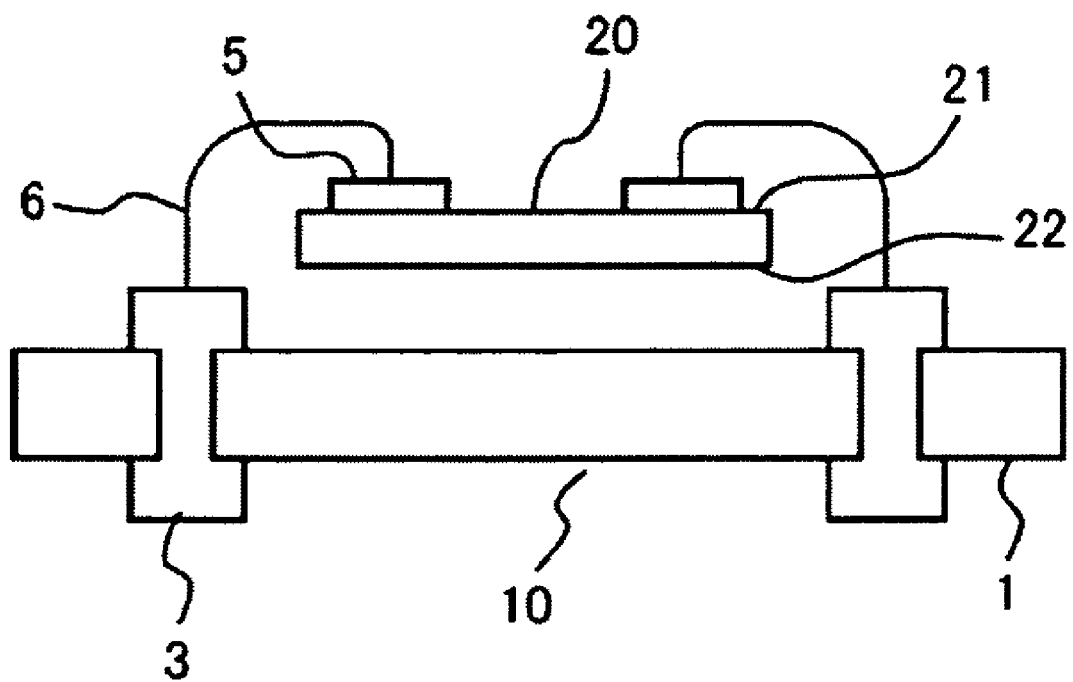
FIG. 8 shows a second construction example of a micro power converter using the micro inductor shown in FIGS. 6(a), 6(b) and 6(c)
Figure 9:
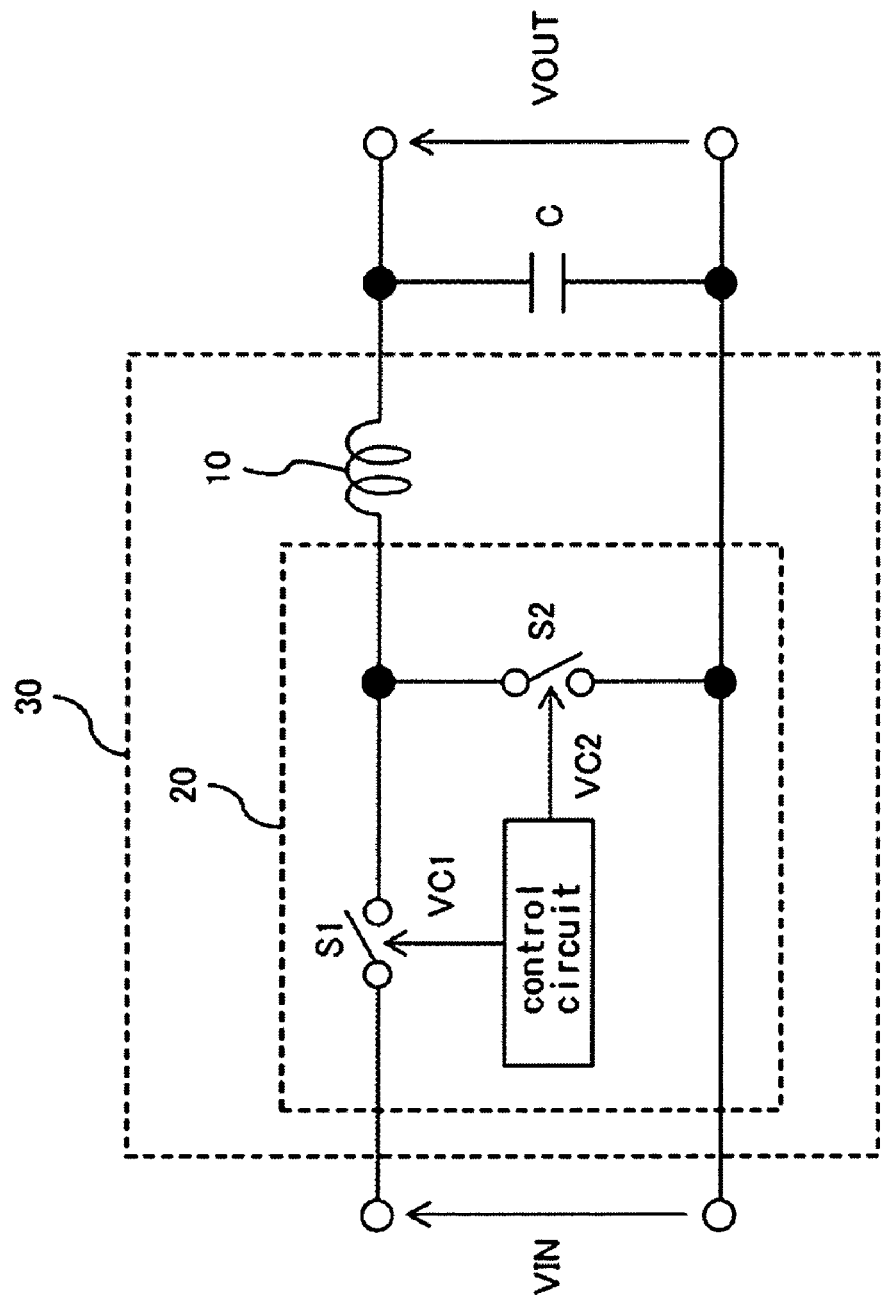
FIG. 9 shows a first conventional example of a specific circuit for implementing a micro power converter.
Figure 10:
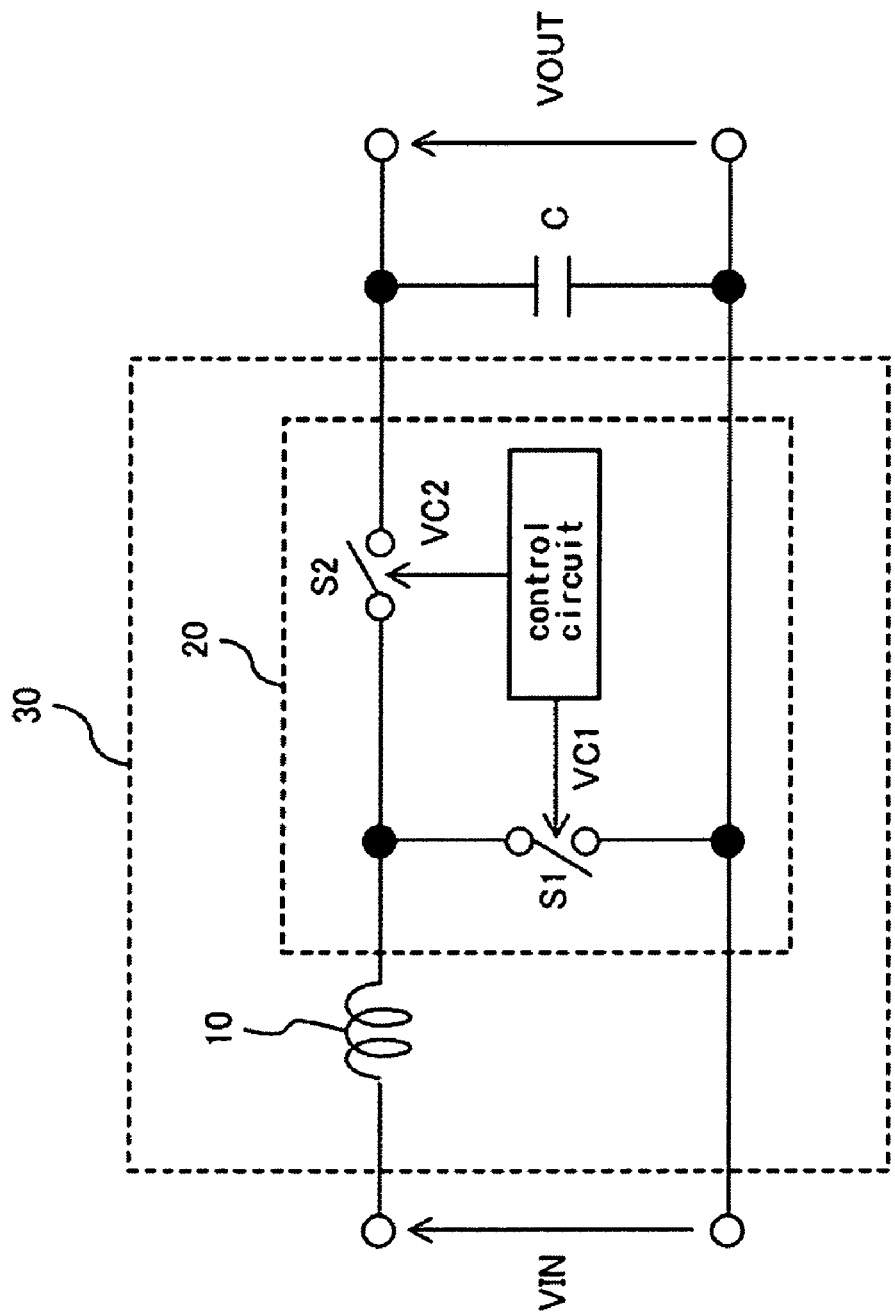
FIG. 10 shows a second conventional example of a specific circuit for implementing a micro power converter.
Figure 11:
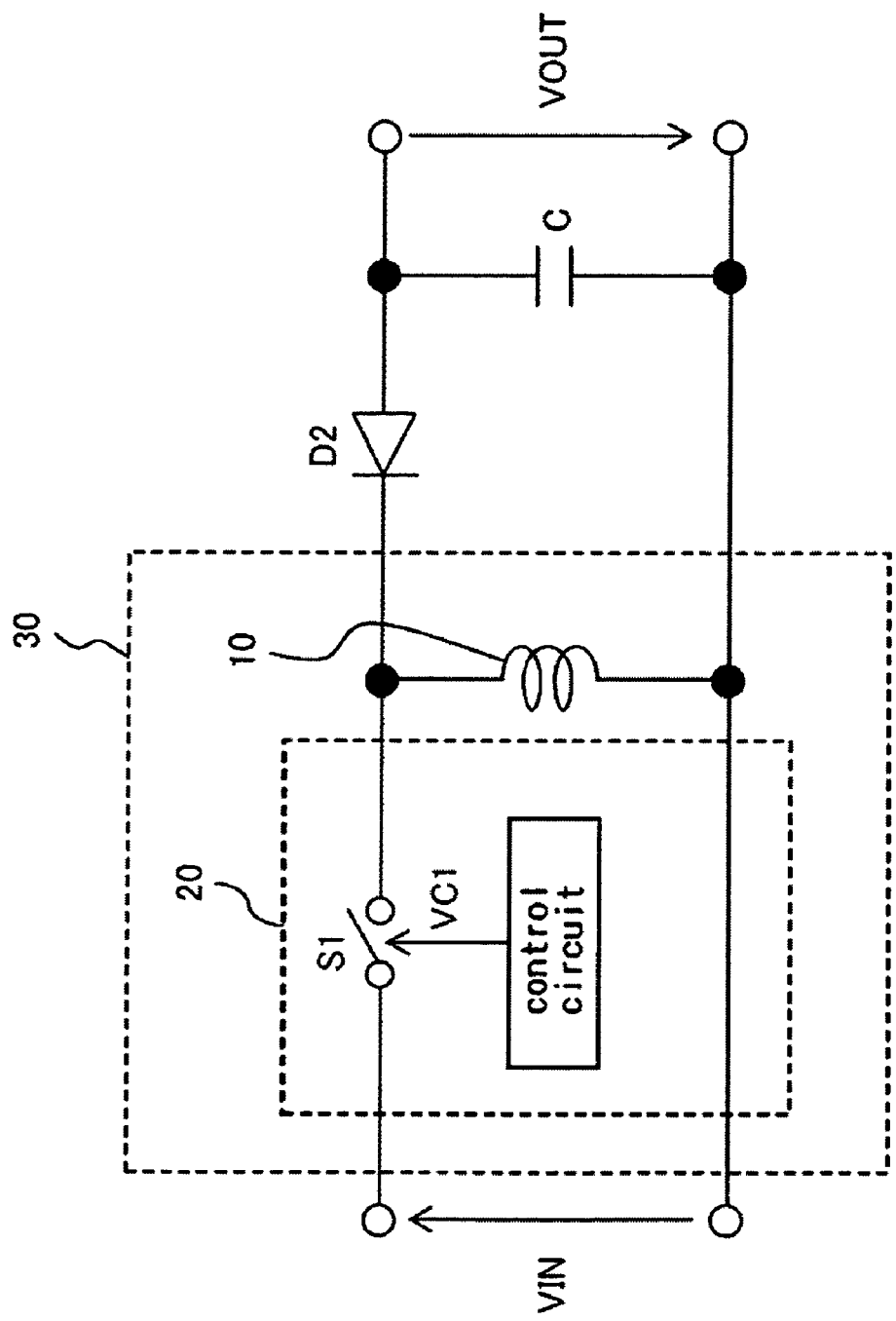
FIG. 11 shows a third conventional example of a specific circuit for implementing a micro power converter.

The micro power converter of the invention may include, in exemplary embodiments, a planar transformer incorporated into the conventional constructions of micro power converters of FIG. 7 and FIG. 8, thereby allowing construction of a flyback converter having an overall size comparable to that of a conventional micro power converter as shown in FIG. 7 and FIG. 8.

Figure 13:
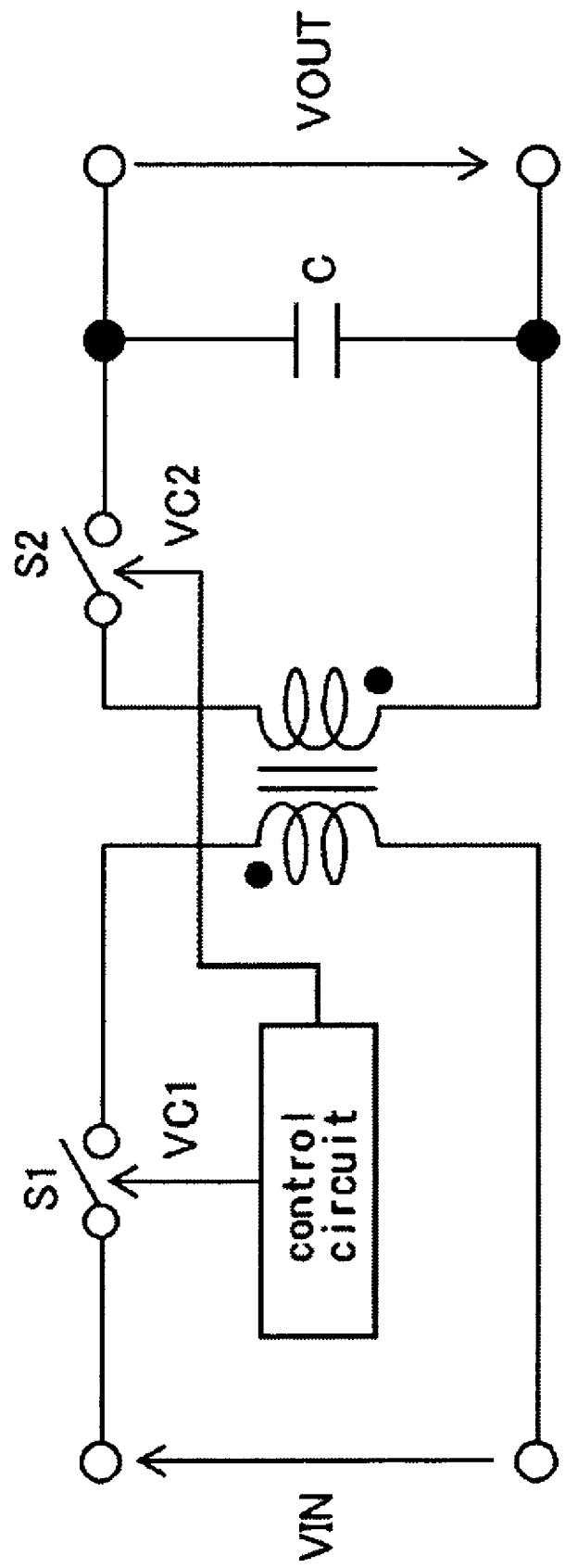
FIG. 13 shows an example of a conventional circuit to implement a flyback converter.

As described previously, a flyback converter can perform step-up and step-down operation by a circuit comprising two semiconductor switches S1 and S2, and a transformer as shown in FIG. 13, for example. A voltage conversion efficiency M (=output voltage/input voltage) is generally represented by the following equation:

$$M=D/(n(1-D)) \quad (1),$$

where D is an on-time ratio of the switch S1 and n is a ratio of the number of the primary windings to the number of secondary windings.

With the variation of the on-time ratio D of the switch S1 from zero to one in equation (1), the voltage conversion efficiency M of a flyback converter varies from zero to infinity. Thus, step-up and step-down operation can be achieved by adjusting the on-time ratio D of the switch S1.

Figure 12:
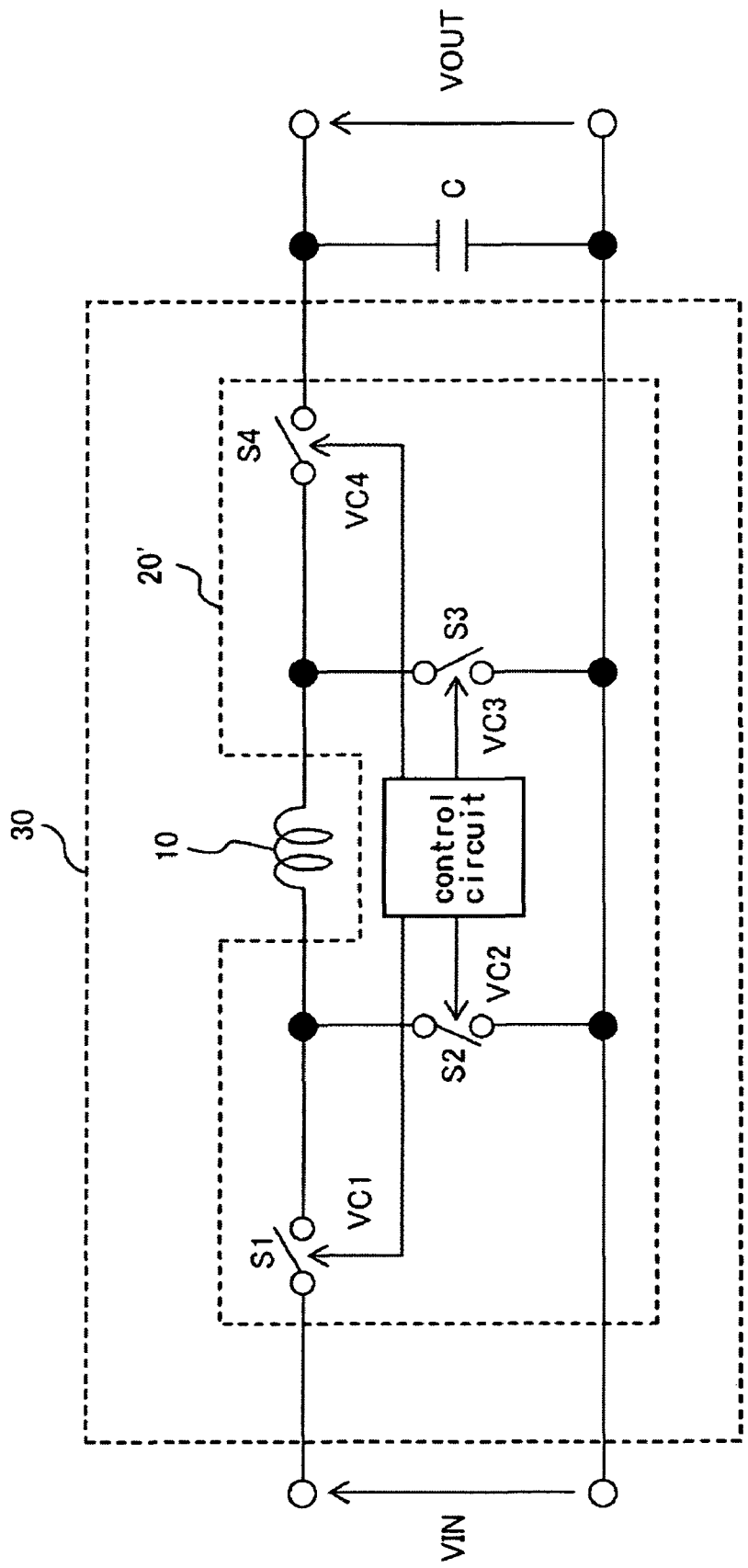
FIG. 12 shows an example of a circuit that may be implemented using the conventional examples shown in FIGS. 9, 10 and 11.

Accordingly, a micro power converter of an embodiment of the invention has a circuit construction shown in FIG. 1. Referring to FIG. 1, the micro power converter 300 of an embodiment of the invention comprises a micro transformer 100 comprising a planar transformer mentioned previously, and a semiconductor chip 200 including semiconductor switches S1, S2, and a control circuit 400 for controlling the switches. The micro power converter having this construction does not require four switches like the example of step-up and step-down converter circuit shown in FIG. 12 and constructs a flyback converter with only two semiconductor switches, solving the problems accompanied by the circuit example of FIG. 12, and implementing a micro power converter of a step-up and step-down type.

Operation of the semiconductor switches S1 and S2 based on a ground potential facilitates drive of the semiconductor switches S1, S2 and simplifies construction of the semiconductor chip 200. The two semiconductor switches S1, S2 can be composed of NPN transistors or N-type semiconductor switches represented by N-channel MOSFET (metal oxide semiconductor field effect transistor), which performs faster switching operations than P-type semiconductor switches. Therefore, the converter performs fast switching operations and has a reduced size thereof.

The semiconductor switch S2 shown in FIG. 1 can be replaced by a diode if degradation of efficiency is ignored. This embodiment of the invention, however, is concerned about the degradation of efficiency due to the use of a diode and employs a transistor or an N-type semiconductor switch including a MOSFET, a bipolar transistor, or an IGBT (insulated gate bipolar transistor), to actualize the circuit. Excepting the degradation of efficiency due to usage of a diode, operation of the semiconductor switch S2 is similar whether implemented by a diode or a semiconductor switch, with either the diode or the semiconductor switch performing appropriate operation by controlling the switch S1 and the switch S2 for complementary on-off action (when one switch is on, the other is off). Nevertheless, when a negative polar situation of inductor current is to be avoided, a state in which both the switch S1 and the switch S2 are in the off state is employed.

Figure 2A:
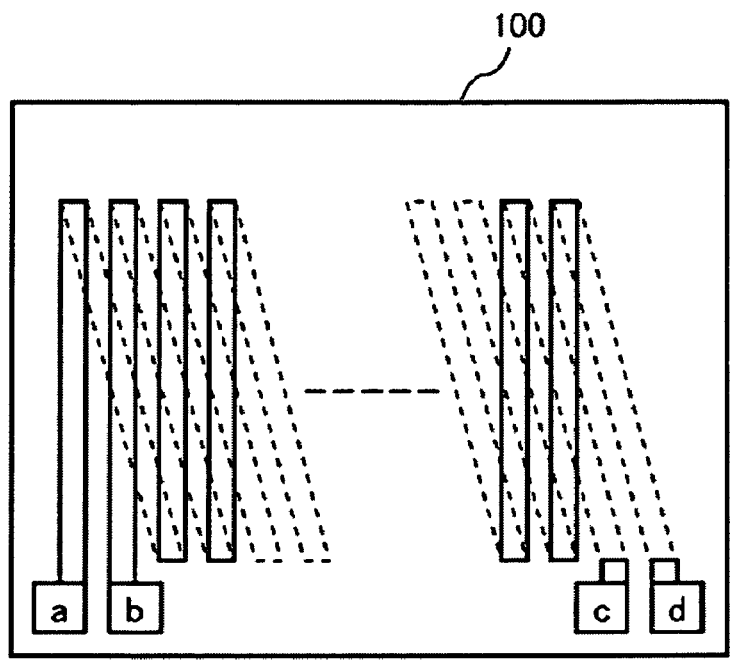
FIGS. 2(a) and 2(b) show a first coil pattern of a micro transformer used in the micro power converter as shown in FIG. 1.
Figure 2B:
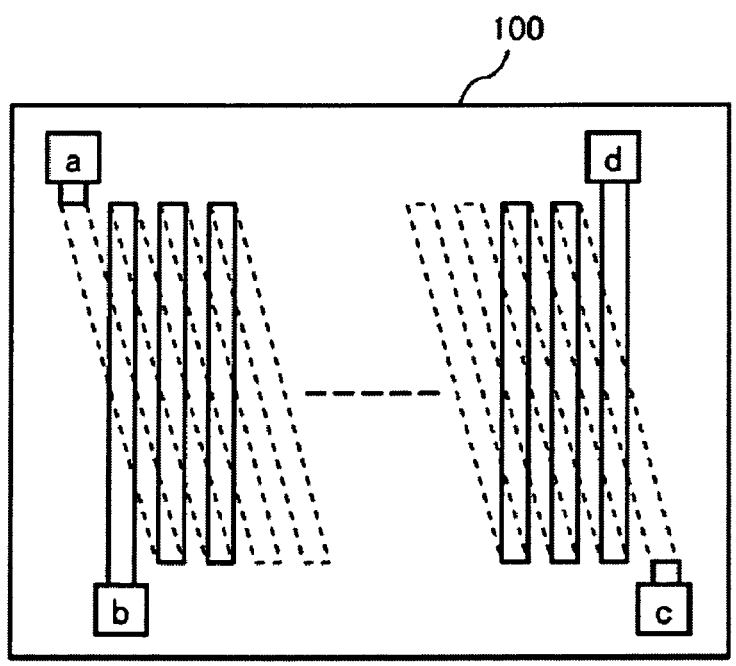

FIGS. 2(a), 2(b) and FIGS. 3(a), 3(b), 3(c) show coil patterns of a micro transformer 100 used in a micro power converter 300 of FIG. 1. FIGS. 2(a) and 2(b) show coil patterns in which the primary coil (t1 to t1') of the micro transformer 100 in FIG. 1 and the secondary coil (t2 to t2') of the micro transformer 100 of FIG. 1 are wound so that one turn of the primary coil corresponds to one turn of the secondary coil.

An alternate winding is possible such that several turns of the primary coil correspond to several turns of the secondary coil. The number of turns of the primary coil need not be the same as the number of turns of the secondary coil. In the transformer example 1 shown in FIG. 2(a), coil terminals a, b, c, and d are arranged on one side of a magnetic core. Though in the transformer example 2 shown in FIG. 2(b) the terminals a and d are arranged on the upper side in the Figure, an arrangement of the terminals at the left and the right sides is possible, too. Similar possible configurations are applicable to the terminals b and c in FIG. 2(b).

Figure 3A:
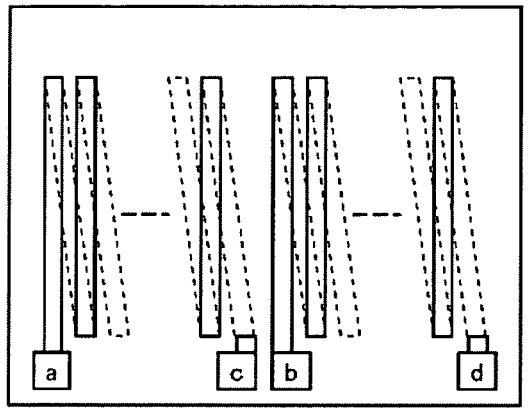
FIGS. 3(a), 3(b) and 3(c) show a second coil pattern of a micro transformer used in the micro power converter as shown in FIG. 1.
Figure 3B:
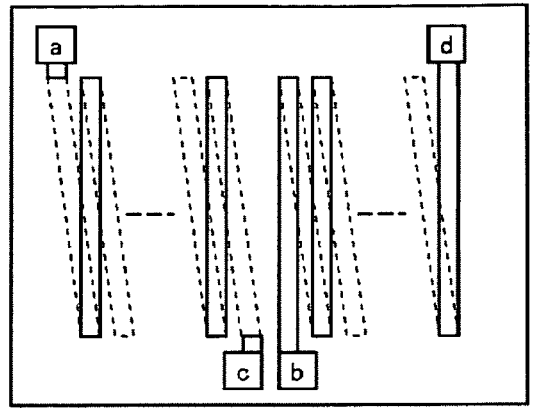
Figure 3C:
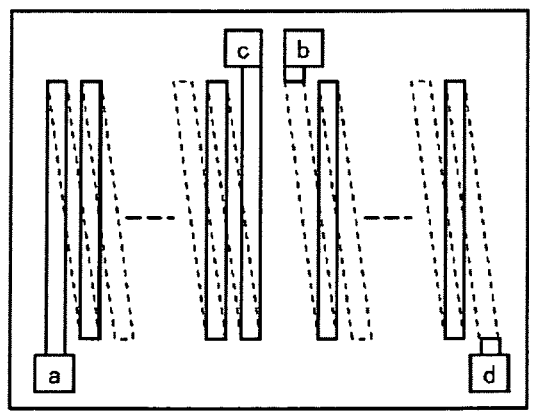

FIGS. 3(a), 3(b), and 3(c) show coil patterns in which the primary coil (t1 to t1') of the micro transformer 100 in FIG. 1 and the secondary coil (t2 to t2') of the micro transformer 100 in FIG. 1 are separately wound. In the transformer example 3 shown in FIG. 3(a), coil terminals a, b, c, and d are arranged on one side of a magnetic core. Though the terminals a and d of the transformer example 4 shown in FIG. 3(b) are arranged on the upper side in the Figure, these terminals can be arranged along any side of the magnetic core. The terminals a and d of the transformer example 5 shown in FIG. 3(c) can also be arranged along sides other than that shown.

FIGS. 4(a), 4(b), 4(c) and FIGS. 5(a), 5(b), 5(c) show arrangement examples of switch S1 and switch S2 in semiconductor chip 200 used in the micro power converter 300 in FIG. 1. Terminals of the switch S1 and the switch S2 are represented by the letters A, C, B, D, E, F, and G in FIGS. 4(a), 4(b), 4(c) and FIGS. 5(a), 5(b), 5(c). It is envisaged in FIGS. 5(a), 5(b), and 5(c) that a terminal at a lower potential side of the switch S1 and the switch S2 is connected to a common ground potential terminal G, resulting in a smaller number of terminals than the one in FIGS. 4(a), 4(b), and 4(c). In the switch arrangement examples illustrated in FIGS. 4(a), 4(b), 4(c) and FIGS. 5(a), 5(b), 5(c), a switch on the left side is defined as S1. If conformity is needed according to the correspondence shown in Table 1 and Table 2, arrangement of the switch S1 and the switch S2 is exchanged.

Table 1 is a table of correspondence of three cases of terminal correspondence: correspondence 1, correspondence 2, and correspondence 3; the correspondence is between a first group of terminals denoted in FIG. 1 and a second group of terminals denoted in FIGS. 4(a), 4(b), 4(c) and FIGS. 5(a), 5(b), 5(c); the first group including terminals s1, s1' of switch S1 and terminals s2, s2' of switch S2, and the second group including terminals A, C; E, G of switch S1 and terminals B, D; F, G of switch S2.

TABLE 1

Correspondence between the terminals of the switches in FIG. 1 and the terminals of the switches in FIG. 4 and FIG. 5

| | switch | | | |
|---|---|---|---|---|
| | S1 | | S2 | |
| switch terminal | s1 | s1' | s2 | s2' |
| switch terminal correspondence 1 | A | C | B | D |
| switch terminal correspondence 2 | C | A | D | B |
| switch terminal correspondence 3 | E | G | F | G |

Table 2 is a table of correspondence of transformer terminals between a first group of terminals denoted in FIG. 1 and a second group of terminals denoted in FIGS. 2(a), 2(b), and FIGS. 3(a), 3(b), 3(c); the first terminal group including transformer terminals t1, t1' of the primary coil (t1 to t1') and transformer terminals t2, t2' of the secondary coil (t2 to t2'), and the second group of terminals including transformer terminals a, b, d, and d in FIGS. 2(a), 2(b), and FIGS. 3(a), 3(b), 3(c).

TABLE 2

Correspondence between the terminals of the transformer in FIG. 1 and the terminals of the transformer in FIG. 2 and FIG. 3

| switch terminal correspondence | transformer | primary side | | secondary side | |
|---|---|---|---|---|---|
| | | t1 | t1' | t2 | t2' |
| switch terminal correspondence 1 | transf. ex. 1 | c | a | b | d |
| | | d | b | a | c |
| | transf. ex. 2 | d | b | a | c |
| | transf. ex. 3 | c | a | b | d |
| | transf. ex. 4 | — | — | — | — |
| | transf. ex. 5 | c | a | b | d |
| switch terminal correspondence 2 | transf. ex. 1 | c | a | b | d |
| | | d | b | a | c |
| | transf. ex. 2 | d | b | a | c |
| | transf. ex. 3 | c | a | b | d |
| | | a | c | d | b |
| | transf. ex. 4 | a | c | d | b |
| | transf. ex. 5 | c | a | b | d |
| switch terminal correspondence 3 | transf. ex. 1 | c | a | b | d |
| | | d | b | a | c |
| | transf. ex. 2 | d | b | a | c |
| | transf. ex. 3 | c | a | b | d |
| | transf. ex. 4 | — | — | — | — |
| | transf. ex. 5 | c | a | b | d |

According to the correspondence shown in Table 1 and Table 2, the terminals of the micro transformer 100 and the terminals of the semiconductor chip 200 shown in FIG. 1 are connected with a structure using a joint 4 (that is a bump) and a pad 5 as shown in FIG. 7, or with a structure using a wire 6 and a pad 5 as shown in FIG. 8, obtaining a miniaturized construction. The arrangement of the transformer shown in FIGS. 2(a), 2(b), 2(c) and FIGS. 3(a), 3(b), 3(c) are determined in the assumption of a structure that uses the wire 6 and the pad 5 shown in FIG. 8. A structure using the joint 4 and the pad 5 shown in FIG. 7 can be obtained as well by reversing the left and the right either in the construction of the transformer shown in FIGS. 2(a), 2(b), and FIGS. 3(a), 3(b), 3(c), or in the construction of the semiconductor chip in FIGS. 4(a), 4(b), 4(c) and FIGS. 5(a), 5(b), 5(c), to obtain an appropriate construction.

A supplementary description to the tables of correspondence of Table 1 and Table 2 is given here. Regarding the upper arrangement of transformer example 3 in the switch terminals correspondence 2 in Table 2 and arrangement of the switch terminals of S1 and S2 in the switch terminals correspondence 2 in Table 1, the a and d terminals at the outside of the micro transformer 100 (the transformer example 3) are connected to the c and d terminals at the inside of the semiconductor chip 200, and the c and b terminals at the inside of the micro transformer 100 are connected from the back surface of FIG. 3(a). (Terminals are provided on the back surface as well.)

While the invention has been described with respect to the specific embodiments, it will be apparent to those skilled in the art that various changes and modifications may be made without departing from the spirit and scope of the invention as defined in the following claims.

What is claimed is:

1. A micro power converter comprising:
    a micro transformer having a conductor and a planar magnetic core, the conductor wound on and through the planar magnetic core to form primary and secondary coils; and a semiconductor chip having first and second semiconductor switches mounted thereon, the first semiconductor switch connected to the primary coil, the second semiconductor switch connected to the secondary coil, and the first and second semiconductor switches each directly connected to a ground potential.

2. The micro power converter according to claim 1, wherein the two semiconductor switches each comprise one N-type semiconductor switch.

3. The micro power converter according to claim 2, wherein sources of the N-type semiconductor switches are arranged side by side on the semiconductor chip.

4. The micro power converter according to claim 2, wherein emitters of the N-type semiconductor switches are arranged side by side on the semiconductor chip.

5. The micro power converter according to claim 1, wherein the micro power converter is a step-up and step-down power converter.

6. The micro power converter according to claim 1, wherein the primary and secondary coils are arranged so that one turn of the primary coil corresponds to one turn of the secondary coil.

7. The micro power converter according to claim 1, wherein the primary and secondary coils are arranged so that plural turns of the primary coil correspond to plural turns of the secondary coil.

8. The micro power converter according to claim 1, wherein the primary and secondary coils are wound together.

9. The micro power converter according to claim 1, wherein the primary and secondary coils are separately wound.

* * * * *